United States Patent [19]

Eggert et al.

[11] Patent Number: 5,615,079
[45] Date of Patent: Mar. 25, 1997

[54] MODULAR CONTROL APPARATUS FOR AUTOMATED BUILDINGS

[75] Inventors: Gerhard Eggert; Walter Hanning, both of Detmold; Uwe Fiene, Steinheim; Michael Schnatwinkel, Herford; Rudolf Steinmeier; Manfred Wilmes, both of Detmold, all of Germany

[73] Assignee: Weidmueller Interface GmbH & Co., Detmold, Germany

[21] Appl. No.: 550,543

[22] Filed: Oct. 30, 1995

[30] Foreign Application Priority Data

Oct. 31, 1994 [DE] Germany .......................... 44 38 804.7

[51] Int. Cl.$^6$ ..................................................... H02B 1/20
[52] U.S. Cl. ........................ 361/637; 361/601; 361/822; 361/823; 439/716
[58] Field of Search ..................................... 361/601, 627, 361/629, 637–640, 822–823; 439/94, 721–724, 716

[56] References Cited

U.S. PATENT DOCUMENTS 4,956,747 9/1990 Beer et al. .............................. 361/814

5,037,310 8/1991 Marinello .............................. 439/716

FOREIGN PATENT DOCUMENTS

| 2845532 | 4/1980 | Germany . |
| 3126535 | 2/1983 | Germany . |
| 3835600 | 5/1990 | Germany . |
| 4303717 | 8/1994 | Germany . |

OTHER PUBLICATIONS

Wolfram Friedl, Gebäudesystemtehnik Die Neue Dimension der Elektroinstallation 1991.
Industrie Anzeiger, p. 83, 1994.

Primary Examiner—Gregory D. Thompson
Attorney, Agent, or Firm—Laubscher & Laubscher

[57] ABSTRACT

A modular control system for automated buildings includes an assembly of terminal blocks mounted as a unit on a mounting block for supplying electrical power and control signals to and from circuits contained in an electronics module mounted on a support rail, thereby to operate associated components of the building. The terminal block assembly includes symmetrical ground, power-supply, control-signal and end-support terminal blocks connected together as a unit. Signal feed-in occurs on both sides of an electronic module arranged on the terminal block assembly.

21 Claims, 17 Drawing Sheets

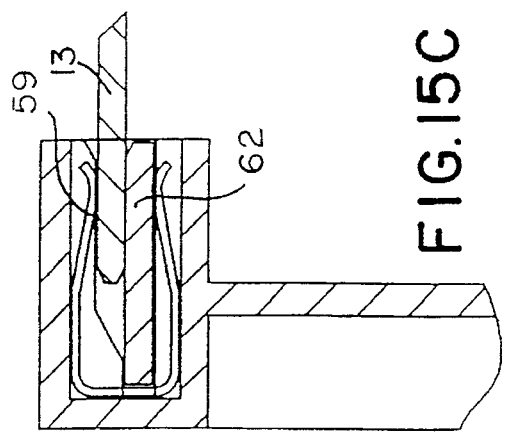
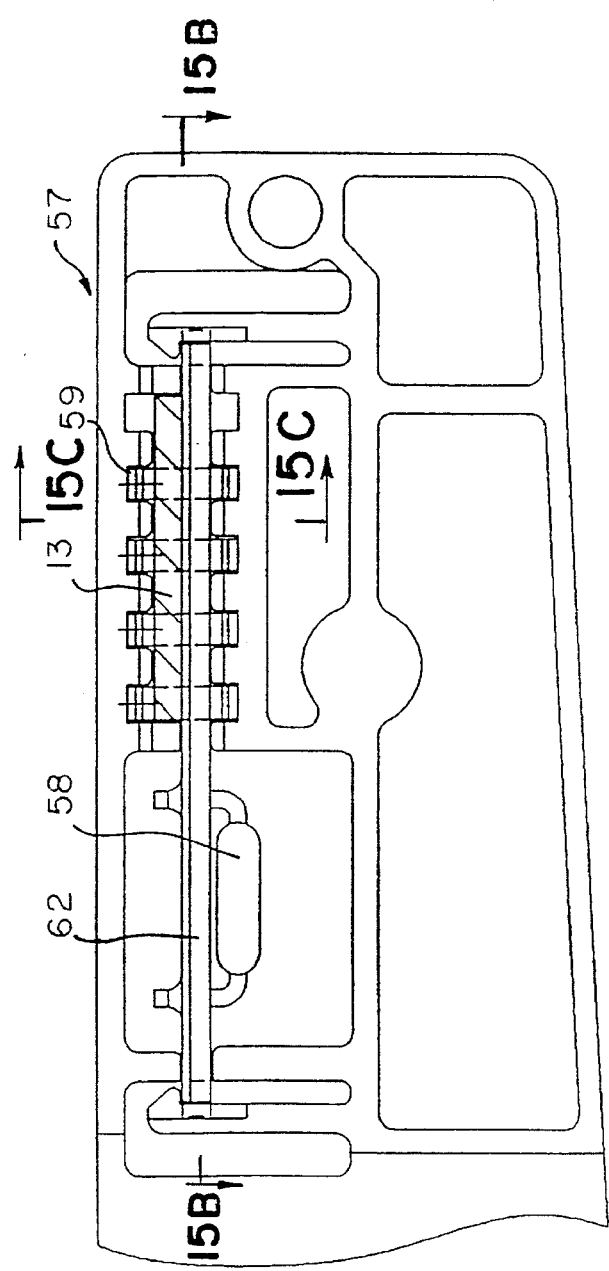
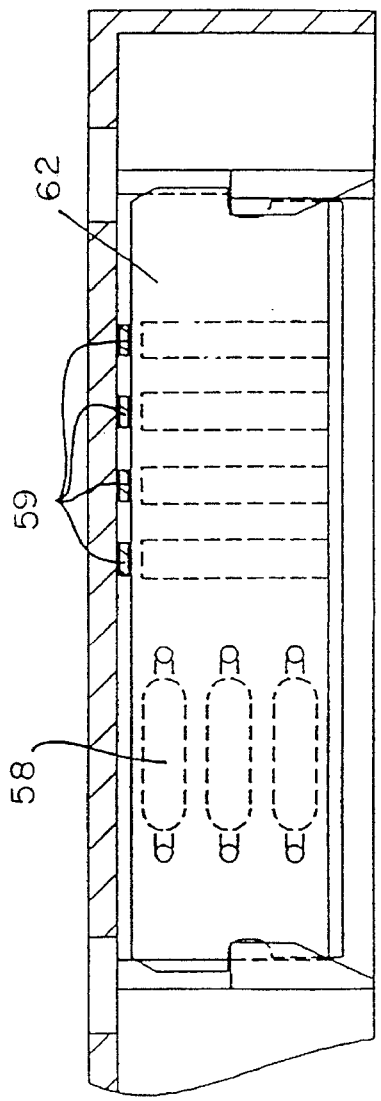

MODULAR CONTROL APPARATUS FOR AUTOMATED BUILDINGS

SPECIFICATION

BACKGROUND OF THE INVENTION

Field of the Invention

This invention relates to a modular control apparatus for use in automated buildings, including a plurality of separate terminal blocks assembled to define a rigid assembly to which is removably connected an electronics module that carries a plurality of control circuits.

Brief Description of the Prior Art

It has been proposed in the prior art to provide electronic control systems for controlling the various electromechanical components used in the heating and cooling, electrical, plumbing and pneumatic systems of an automated building. Until now, electrotechnical installation was such that each individual sensor/reactor/field unit had to be connected directly via a separate signal line to input/output cards of a control unit installed in a central switch cabinet. Subdivisions in the form of terminal or switch boxes were installed to some extent in different places inside the building. The purpose of these terminal boxes was to combine the many sensors/reactors/field units that are distributed throughout the building for the transport of signals into the central switch cabinet. From each terminal box, the cables extend via plug connectors to the central switch cabinet of the control system. Here, again, the individual lines are distributed over the pertinent input/output printed circuit of boards the control system, so that each cable carrying a signal must be conducted in general over a plurality of connecting points. This type of wiring requires an appreciable amount of material and labor, and requires a great effort in terms of planning and documentation and is correspondingly vulnerable to error.

It has also been proposed to provide control systems that are arranged in a decentralized manner in the area of the subdivisions of a building and that provide for a conversion of the incoming signals of the individual sensors/reactors/field units to a complete field bus system for the building. For this purpose, as a rule, one needs a spatially less compactly constructed adaptation electronics that are extensively predetermined by the volume of functions as well as the necessary structural members, thereby requiring a predetermined number of input/output connection elements which are converted to a field bus system via the series-connected electronics. Customarily, subassemblies of identical signal interfaces are offered as connecting blocks in a building that present 8, 16, or even 32 identical connection possibilities. A minimum number of such subassemblies must be installed—and must therefore also be paid for by the user—above all in case of mixed connection possibilities for the existing sensors or connection possibilities that are needed only in small or widely differing numbers.

In the German patent No. DE4303717A1, a modular control system is disclosed that includes a plurality of pluggable electronics modules and connection modules. Here, the connection modules have supply line connections and signal line connections and are formed from individual terminal blocks. In this case, connector blocks associated, on the one hand, with the supply block and, on the other hand, with the input/output block, are also made in one piece and can be inserted individually in a common housing. Also, the supply terminals and/or the input and output terminals are arranged in different connection levels. Furthermore, an electronics module is separably connected with the terminal block, and can be electrically and mechanically connected by means of contacts between the electronics block and the terminal block.

One problem presented by this modular control system is that a spatial separation is made, on the one hand, between the supply block and, on the other hand, between the input/output block. In this solution, it is furthermore required to provide the supply terminals with insertion bridges that must be fixedly installed at the plant or that the user must retrofit at rather considerable expense in order to distribute the electrical potential—belonging to a block or a part of a block—between the individual units of the supply block or the connector block. Moreover, it is not easy to operate sensors/reactors/field units with identical signal form but differing electrical supply values on a common connector block because only supply voltages that are supplied at fixed points and that are distributed laterally can be tapped off the pertinent parts of the connector block. By embedding the individual connection units in a housing surrounding the entire block, one can provide maintenance only after the removal of the entire block which involves the rather laborious breakdown of the connector block into its various parts. One must furthermore provide shunting plates inside the housing of the connection block in order to attain a differentiated logic of the input/output block. This again calls for intervention in the electronics arranged in the housing.

A primary object of the present invention is to provide a terminal block assembly for use in the power supply and control system of an automated building, including an assembly of power supply, control signal, ground and end support terminal blocks arranged in side-by-side relation, and distributor bar means removably supported by, and extending transversely of, the terminal block assembly for transmitting electrical power between the terminal blocks.

According to another object of the invention, the terminal block assembly includes mounting feet means for removably mounting one side of the assembly upon a grounded support rail to which the ground terminal block is electrically connected, and plug-in means for removably connecting to the opposite side of the assembly an electronics module containing printed circuit board signal-handling control means. Thus, condition-responsive signals from remotely arranged sensors in the building are supplied to signal processing means on the printed circuit boards via terminals carried by the signal terminal blocks, and control signals from the printed circuit boards are transmitted by these terminals to various activators and reactors located at given locations in the automated building. Owing to the provision of the terminal block assembly, the user can customize the automation of a building and can install the assembly in existing buildings, the electronics control module being arranged at an accessible location for replacement, modification and/or repair. Owing to the side-by-side relationship of the terminal blocks, a compact assembly is provided that is suitable for installation under tight space conditions. Owing to the provision of the removably mounted distributor bar means, the necessity of bulky wires or cable harnesses between the terminal blocks is avoided.

BRIEF DESCRIPTION OF THE DRAWING

Other objects and advantages of the invention will become apparent from a study of the following specification, when viewed in the light of the accompanying drawing, in which:

FIG. 15a is a detailed sectional view of a signal-suppression terminal block, and FIGS. 15b and 15c are detailed sectional views taken along lines 15b—15b and 15c—15c respectively, of FIG. 15a;

DETAILED DESCRIPTION

Figure 1:
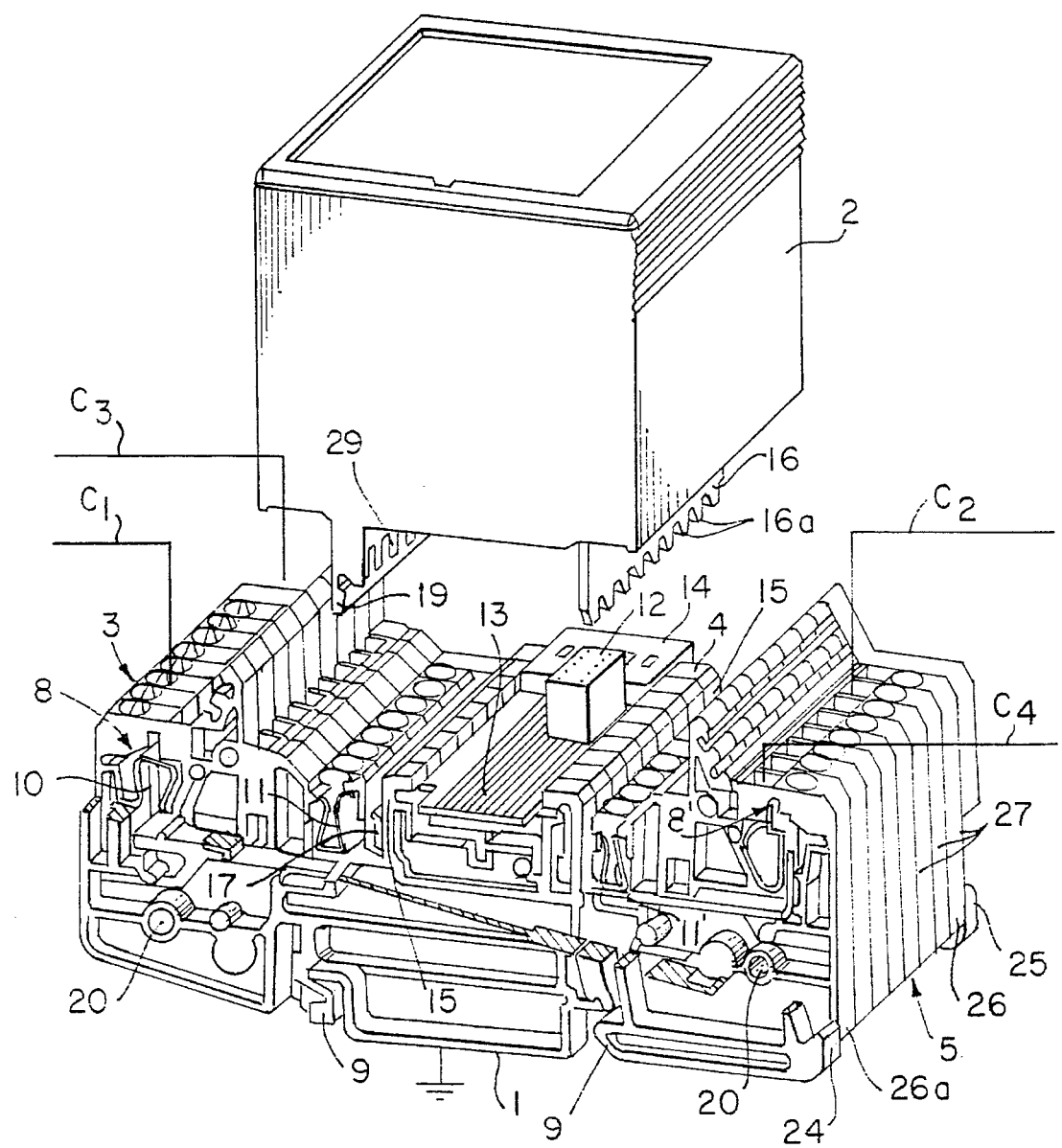
FIG. 1 is a partially disassembled perspective view of the modular control assembly including an electronics module removably separated from its associated terminal block assembly.

Referring first more particularly to FIG. 1, the modular control system of the present invention includes a terminal block assembly 3 that is formed from a plurality of individual terminal blocks 24–27, and upon which is vertically mounted the electronic module 2 that carries the various electronic control circuits for operating the various electrically-operated components of the automated control building system.

Figure 9:
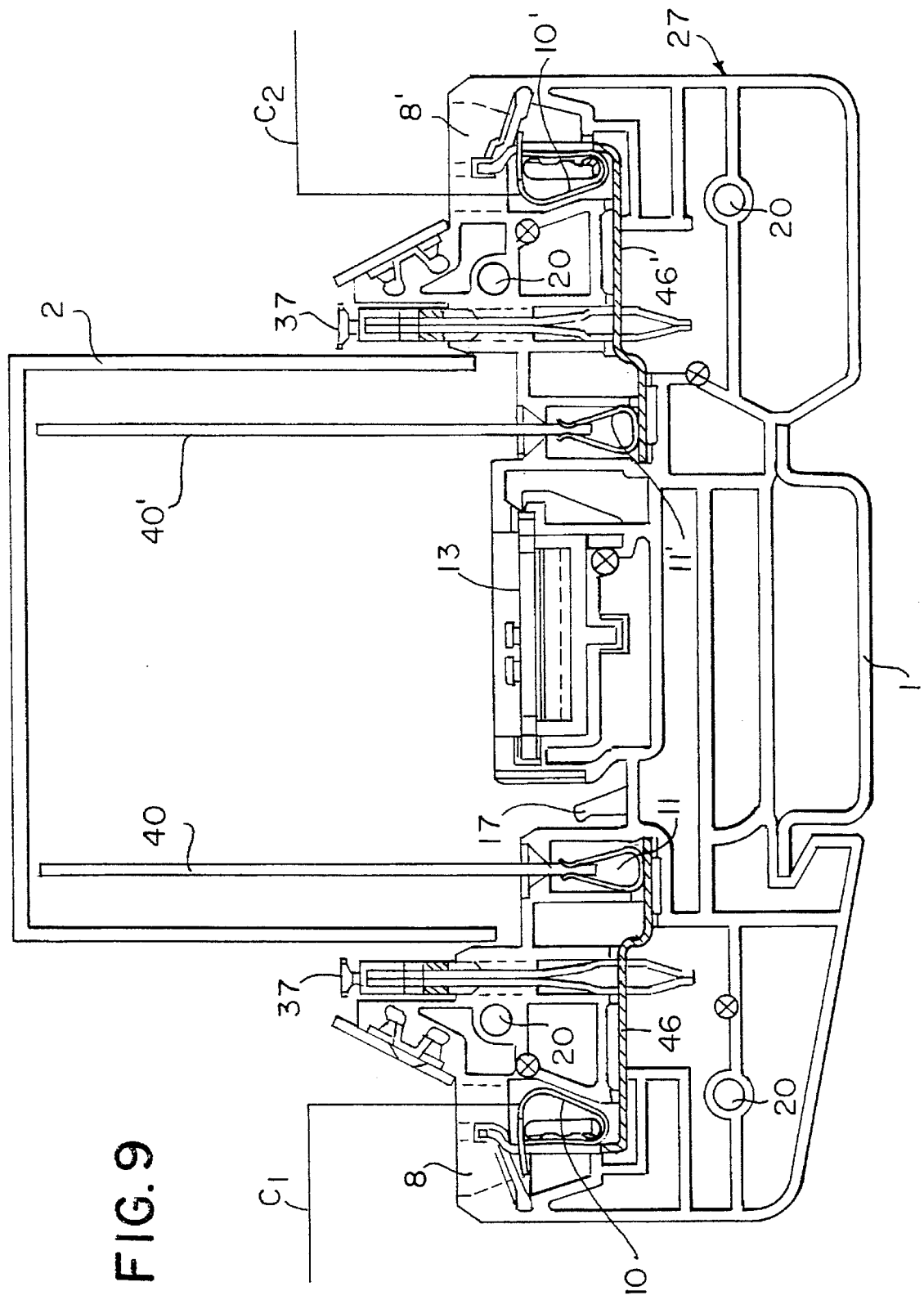
FIG. 9 is a sectional view of a first modification of the supply signal terminal block of FIG. 7 wherein the outermost distributor bar means are eliminated.
Figure 10:
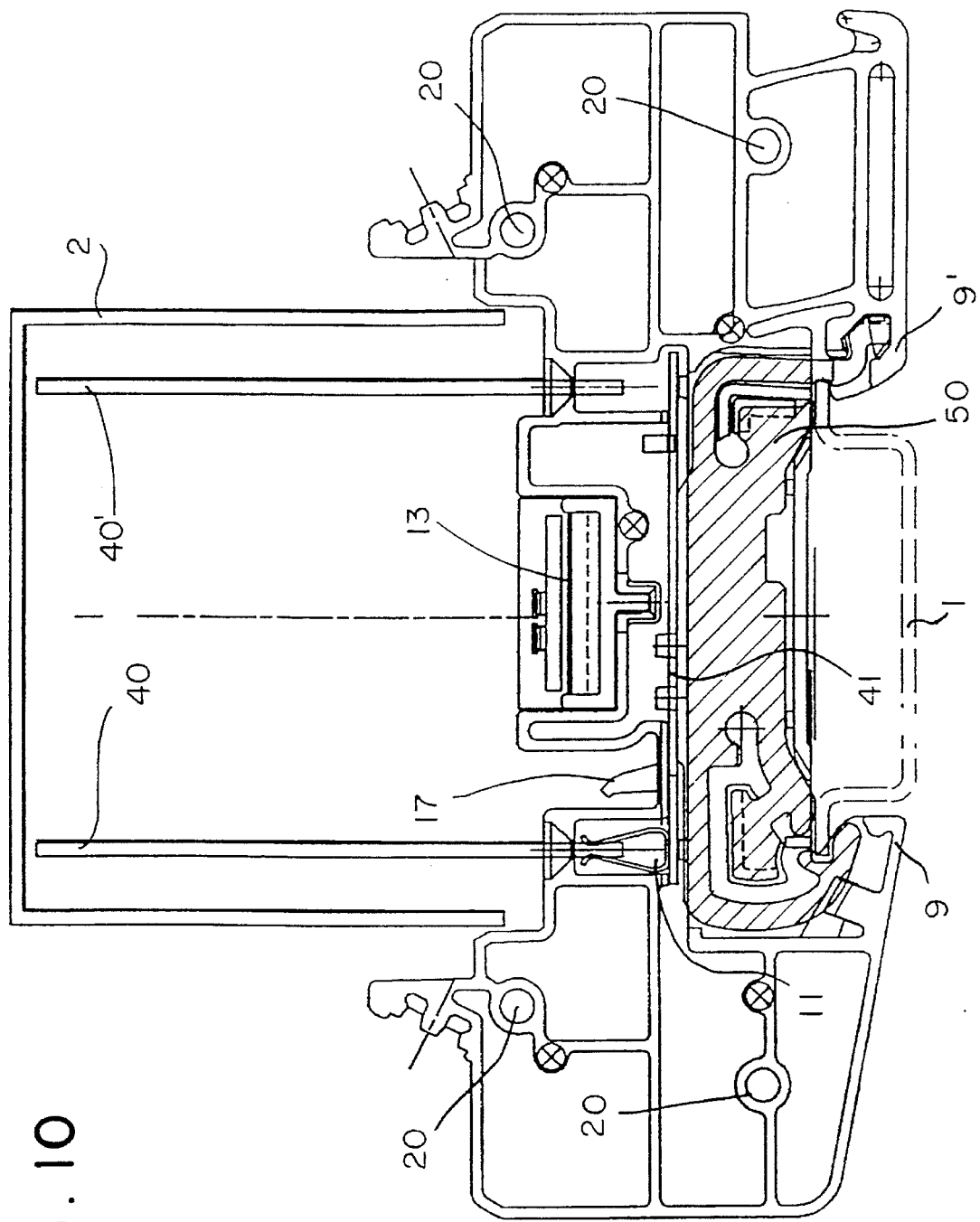
FIG. 10 is a sectional view of a modification of the ground terminal block of FIG. 5 wherein the outermost terminals are eliminated.

The terminal block assembly 3 includes a ground terminal block 25, a power supply terminal block 26, a plurality of control signal supply and receive terminal blocks 27, a second power supply terminal block 26a and an end support terminal block 24. The terminal block assembly 3 is mounted as a unit upon grounded support rail 1, as is known in the art. As shown in FIG. 10, the ground terminal block 25 connects printed circuit board 40 to ground via plug-in terminal 11, bus bar 41, grounding member 50 and rail 1. As shown in FIG. 9, each of the control signal terminal blocks 27 includes a pair of terminal means 8, 8' for supplying control signals to or from the printed circuit boards 40a and 40b mounted within the electronics module 2 relative to signal conductors $C_1$ and $C_2$ via resilient terminals 10, 10', internal bus bars 46, 46', and plug-in terminal means 11, 11', respectively. The electronics module 2, which is vertically plugged into the terminal block assembly 3, includes (as shown in FIG. 1) vertical guide means 16 and latching means 19 that cooperate with corresponding surfaces on the terminal block assembly during mounting of the module on the terminal block assembly, as will be described in greater detail below. Power is supplied to the power supply terminal blocks 26, 26' of the assembly via conductors $C_3$ and $C_4$.

Figure 2:
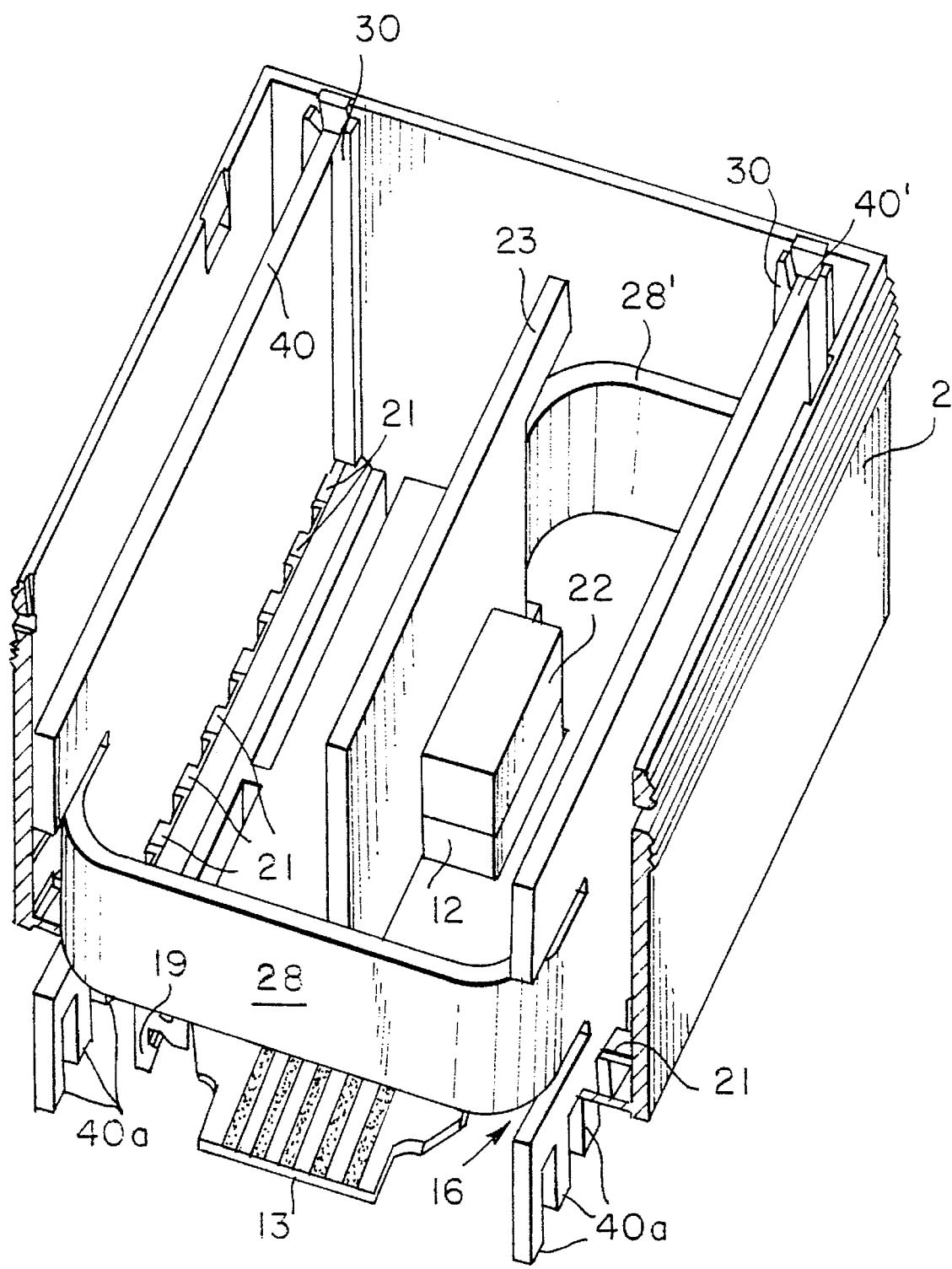
FIG. 2 is a perspective view, with certain parts removed of the electronics control module containing the printed circuit boards that carry the control circuitry for the components of an automated building.

Within the structural space defined within the terminal block enclosed by the housing of electronics module 2 are located all of the electrical contacts that serve to connect the terminal block assembly 3 to the electronics module 2. Thus, the plug-in contacts 11 which connect the signal terminal means 8, 8' are arranged within this space, as well as the plug connector 12 which connects the internal bus bar means 13 to the electronics module 2. The internal bus bar means 13 is connected to the field bus connection module 4 by separable connector means 14. The rows of terminals 11, 11' serve to connect the electronics module 2 to the control signal conductors $C_1$ and $C_2$, respectively, as well as the connections to the ground terminal block 5 and the power supply terminal blocks 26 and 26', as will be discussed below. As shown in FIG. 2, the plug connector 22 on central printed circuit board 23 cooperates with plug connector 12 of the internal bus bar means 13, thereby to electrically connect the electronics module 2 with the terminal block assembly 3. The field bus terminal block 4 arranged behind the assembly 3 permits processing of the signals of the internal bus bar means 13 for connecting a plurality of the terminal block assemblies 3 mounted on the mounting rail 1 with each other or with a central control unit. The terminal blocks include aligned bores 20 through which connecting rods (not shown), extend to lock the terminal blocks of the assembly together as a rigid unit. At each end of this assembly, the ground terminal block 25 and the end support terminal block 24 include mounting feet 9 that cooperate with the mounting rail 1 to connect the terminal block assembly 3 to the rail. The mounting feet 9 are thus locked to the rail 1 by depressing the terminal block assembly 3 in the vertical direction, whereby resilient feet means 9 come into latched engagement with the flange portions of the mounting rail 1.

To release a terminal block assembly 3 from the mounting rail 1 following the removal of the electronics module 2 and after the bus bar means 13 have been removed by means of the separable connector 14, a suitable tool (such as a screwdriver) is inserted beneath the terminal block assembly 3 to lift the same upwardly off the mounting rail 1. Since the various terminal blocks 24–27 are connected together as a unit by the mounting rods that extend through aligned bores 20, the terminal assembly 3 is formed as a rigid assembly.

The guide means 16 on the electronics module 2 include at its lower end molded projections 16a that extend within corresponding openings contained in the terminal block assembly. Similarly, the catch means 19 cooperate with corresponding catch hook means 17 provided on the various terminal blocks 24–27. In addition to these catch means, a number of color-coding elements are provided on the various terminal blocks, thereby assuring proper alignment of the electronics module 2 with predetermined terminal block assemblies 3. It will be noted that the guide means 16 and the catch means 19 are arranged between the connecting terminals 11, 11' on the terminal block assembly 3.

Referring now more particularly to FIG. 2, the two vertical printed circuit boards 40, 40' are removably supported by guide rails 30 between the front and rear end walls of the housing of the electronics module 2, the printed circuit boards being electrically connected together by conductor means 28. Furthermore, the printed circuit board 40' is electrically connected with the central printed circuit board 23 via conductor means 28'. As indicated previously, the central printed circuit board 23 is electrically connected with the internal bus bar means 13 via cooperating plug connectors 12 and 22. The printed circuit boards 40, 40' carry the various circuits for operating the electromechanical load operators of the automated building, for example. The printed circuit boards include downwardly projecting contacts 40a, 40a' that engage the plug-in terminals 11, 11', as shown in FIG. 9. In order to limit the extent of plug-in movement during the assembly of the printed circuit boards 40, 40', there are provided between the projections 40a and 40a' vertical contact bars 21 that produce the exact height adjustments of the printed circuit boards 40 and 40'.

Figure 5:
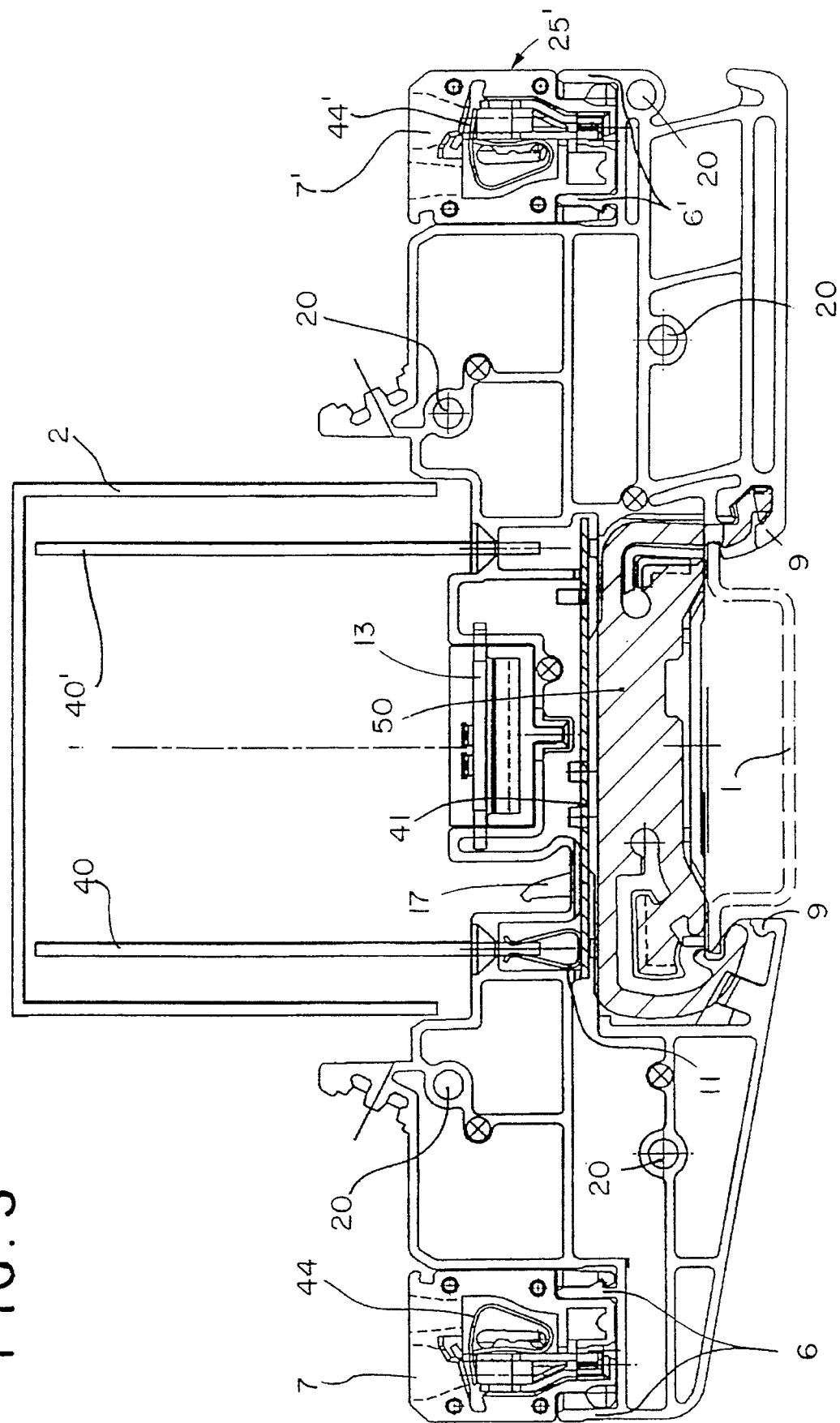
FIG. 5 is a sectional view of a ground terminal block with the electronics module connected thereto.

According to another embodiment, the assembly formed by the terminal blocks of FIGS. 5–8 is preferably provided with means for supporting distribution bar means 7, which distribution bars extend transversely between the respective terminal blocks of the assembly. Referring more specifically to FIG. 5, the ground terminal block 25' at one end of the terminal block assembly includes a metal grounding conductor 50 that is electrically grounded to the support rail 1, the grounding conductor being connected with printed circuit board 40 via stationary bus bar 41, plug terminal 11, and printed circuit board connection 40a. The distributor bars 7 and 7' are removably supported by guide and catch means 6, 6' at each end of the ground terminal block 25.

Figure 6:
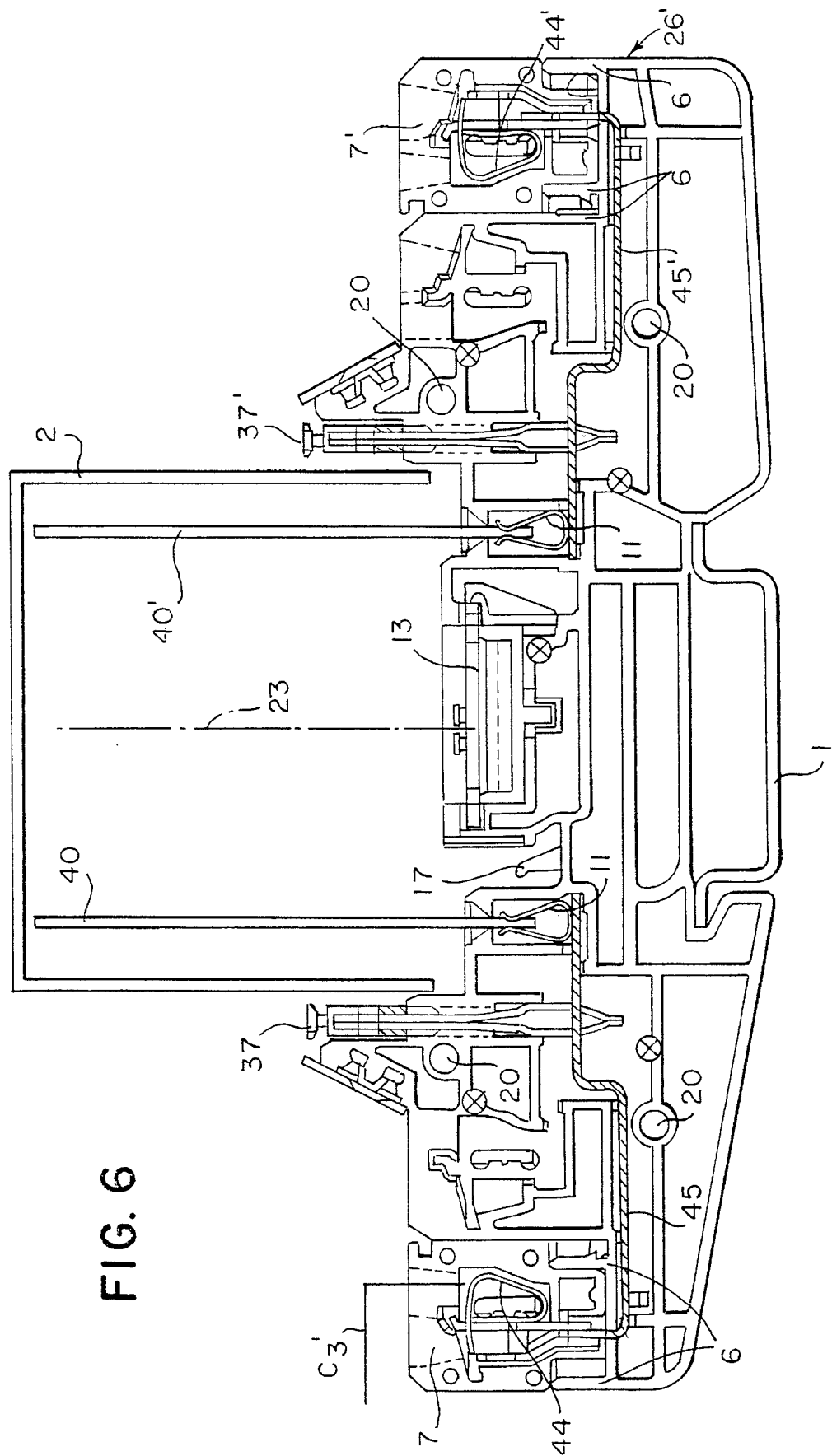
FIG. 6 is a sectional view of a power supply terminal block with the electronics module connected thereto.

Referring now to FIG. 6, the power supply terminal block 26 supports distributor bars 7 and 7' having resilient terminals 44, 44', respectively, connected with printed circuit boards 40, 40' via stationary bus bars 45 and 45', and resilient plug-in terminals 11. Lateral tap means 37, 37' are provided for affording lateral connection of the internal bus bars 45, 45' to other terminal blocks, as desired.

Figure 7:
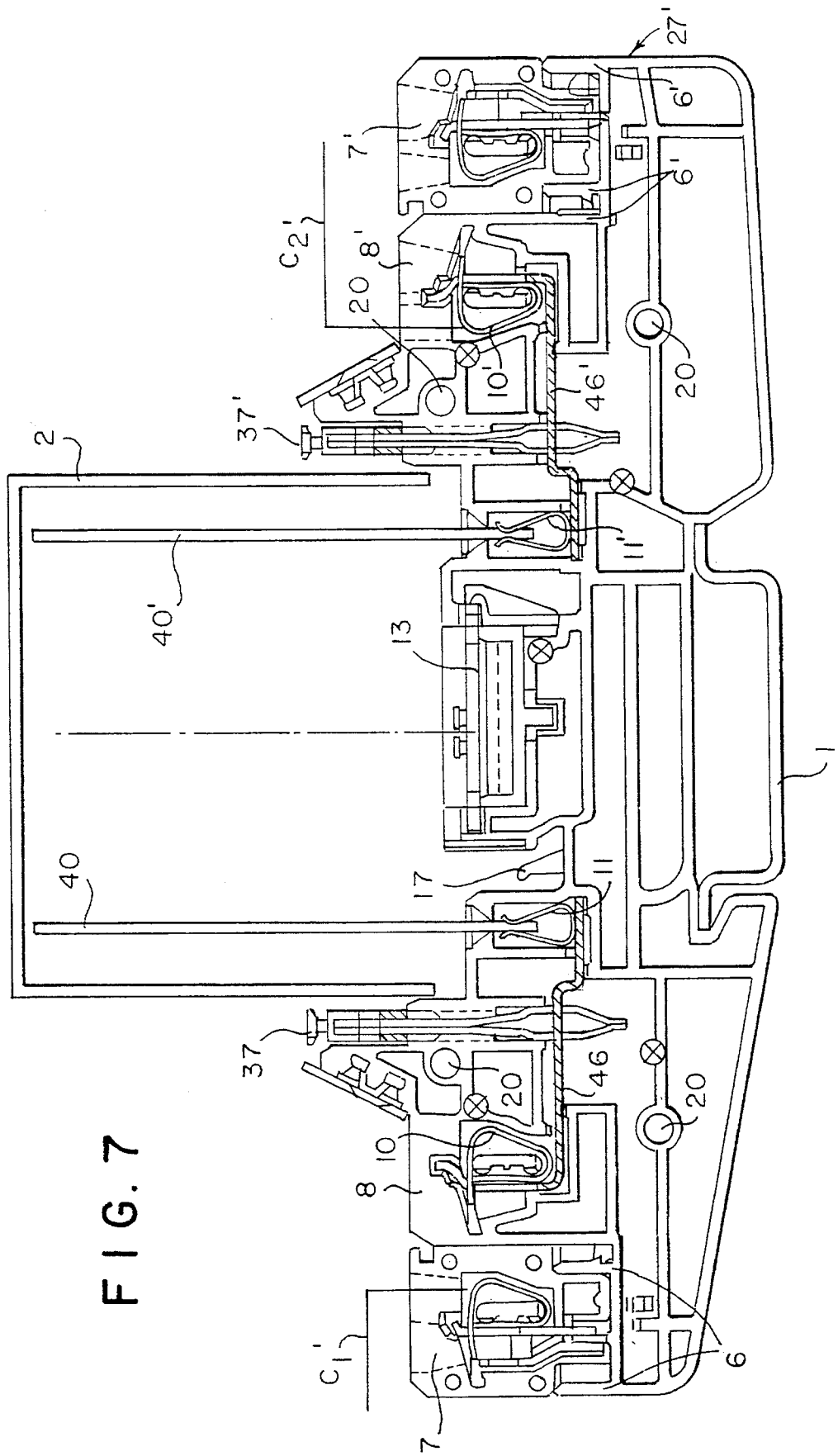
FIG. 7 is a sectional view of a supply signal terminal block with the electronics module connected thereto.

As shown in FIG. 7, the control signal supply and receive terminal block 27' corresponds generally with the supply signal terminal block 27 of FIG. 9, except that each end of the terminal block has been extended to support the distributor bars 7 and 7', respectively. Thus, the control signals to and from the circuits of printed circuit boards 40, 40' are connected with the control signal conductors $C_1$, and $C_2$, via terminals 10, 10', bus bars 46, 46', and resilient plug-in terminals 11, 11', respectively.

Figure 8:
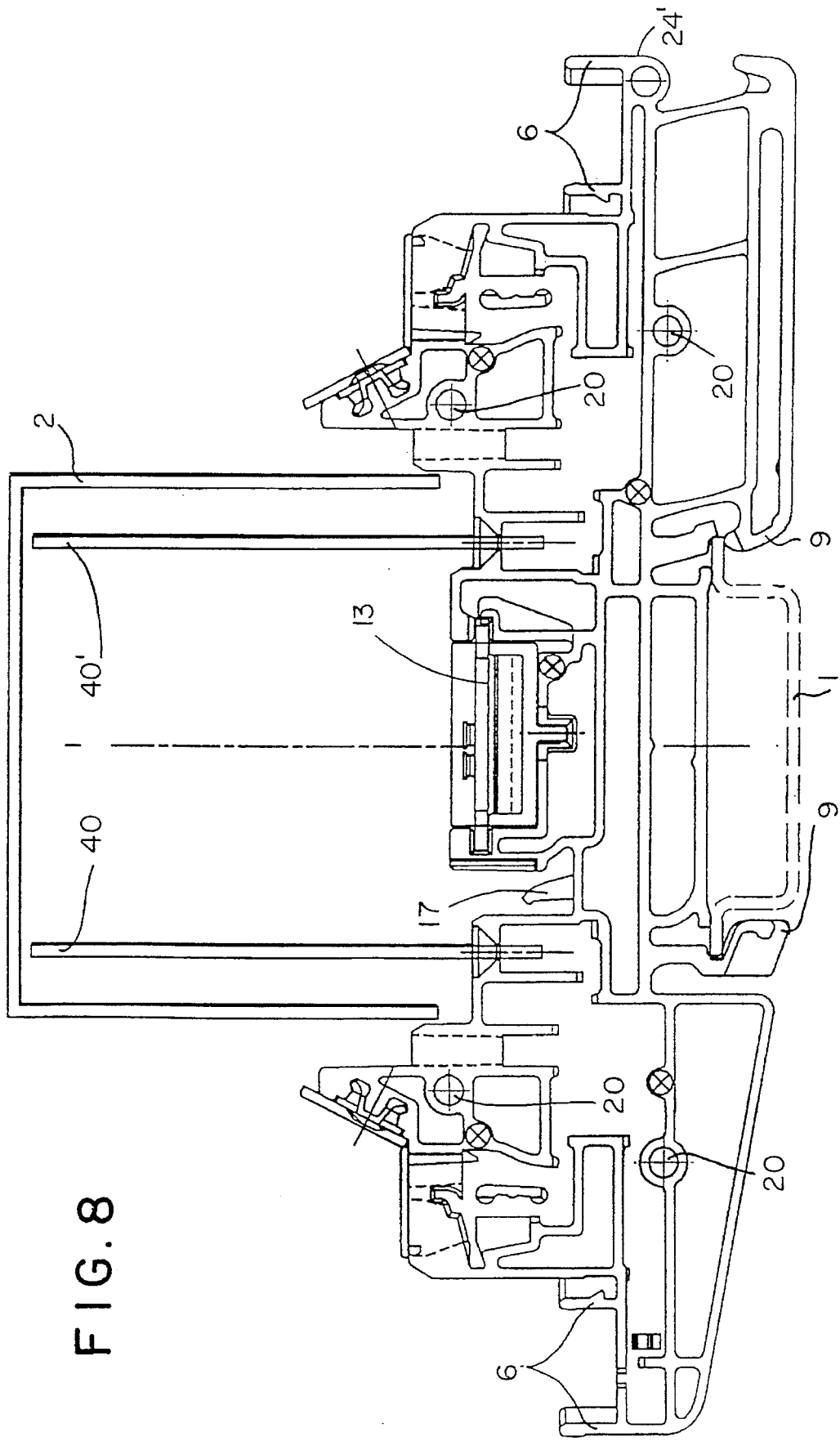
FIG. 8 is a sectional view of an end support terminal block with an electronics module mounted thereon.

FIG. 8 illustrates the end support terminal block 24, which is provided with catch feet 9 for connection with the support rail 1. This terminal block is not electrically connected with the printed circuit boards 40, 40' nor with any of other terminal blocks.

Figure 11:
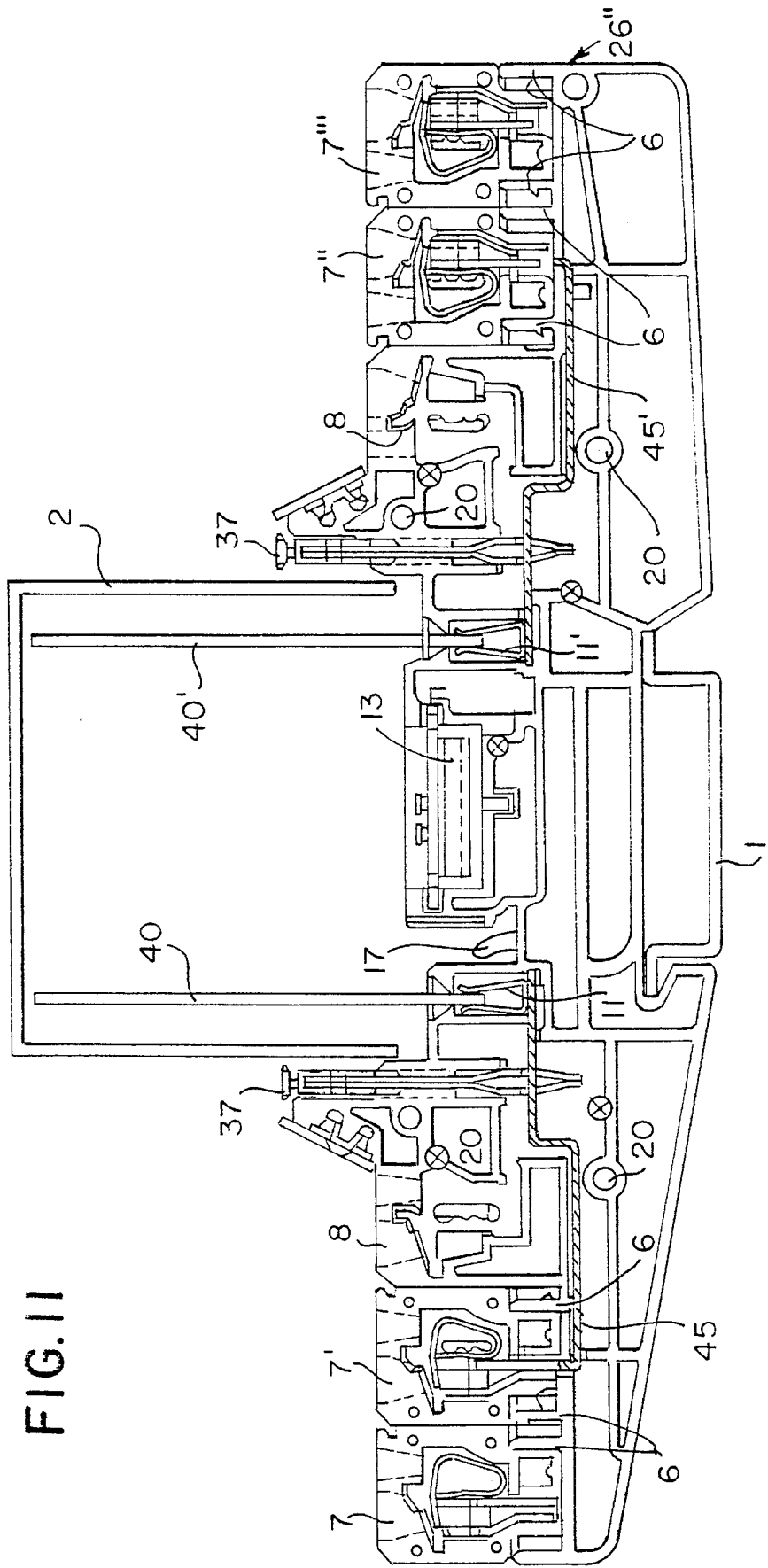
FIG. 11 is a sectional view of a modification of the input terminal block of FIG. 6, wherein a pair of distributor terminals are provided at each end of the terminal block.
Figure 12:
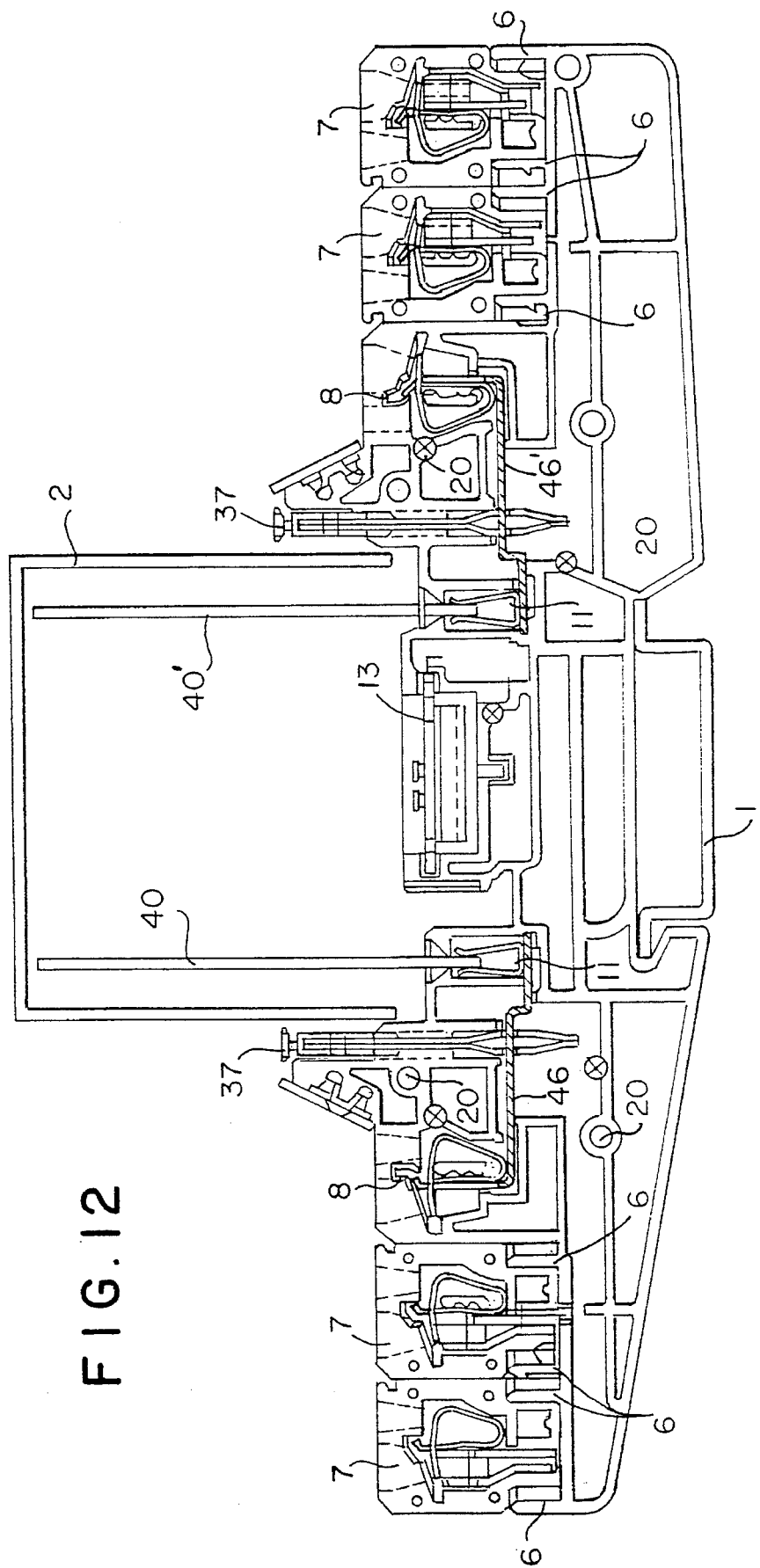
FIG. 12 is a sectional view of a first modification of the supply signal terminal block of FIG. 7, wherein a pair of terminals are provided at each end of the terminal block.
Figure 13:
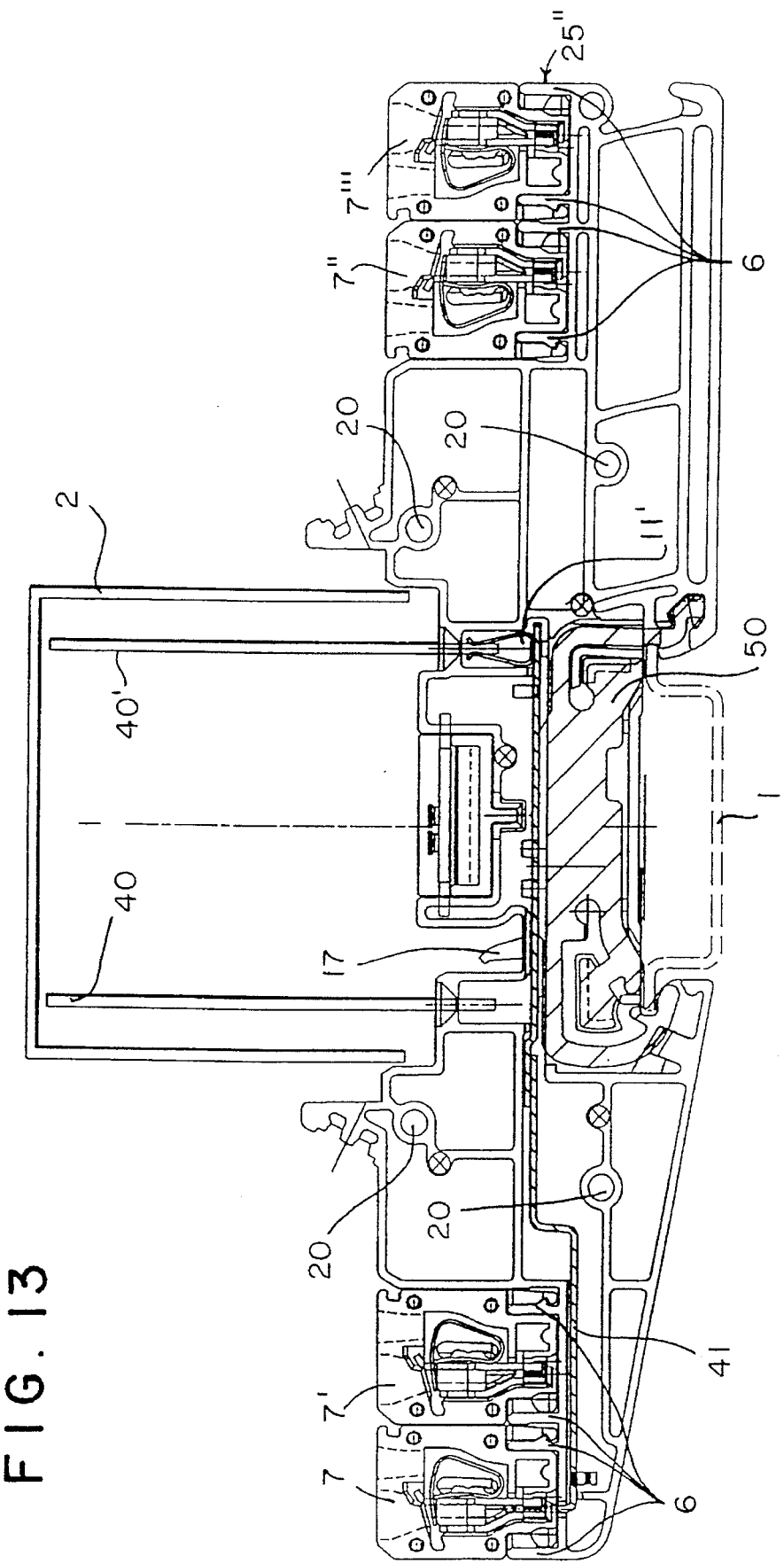
FIG. 13 is a sectional view of a modification of the ground terminal block of FIG. 5, wherein a pair of terminals are provided at each and of the terminal block.

FIGS. 11–13 illustrate double-distributor-bar types of terminal blocks for supporting pairs of distributor bars 7,7' and 7", 7'" at opposite ends of the assembly. In the power supply terminal block 26" of FIG. 11, the distributor bar 7" is connected with printed circuit board 40 via bus bar 45 and terminal 11, and distributor bar 7" is connected with printed circuit board 40' via bus bar 45' and terminal 11'. The distributor bars are maintained in place on the terminal block by the previously described catch means 6. Similarly, the control signal terminal block 27' of FIG. 12 includes signal input terminals 8, 8' connected with printed circuit boards 40, 40' via bus bars 46 and 46', respectively. In the ground terminal block 25" of FIG. 13, printed circuit board 40' is connected with round via terminal 11', bus bar 41, grounding member 50, and rail 1.

Figure 3:
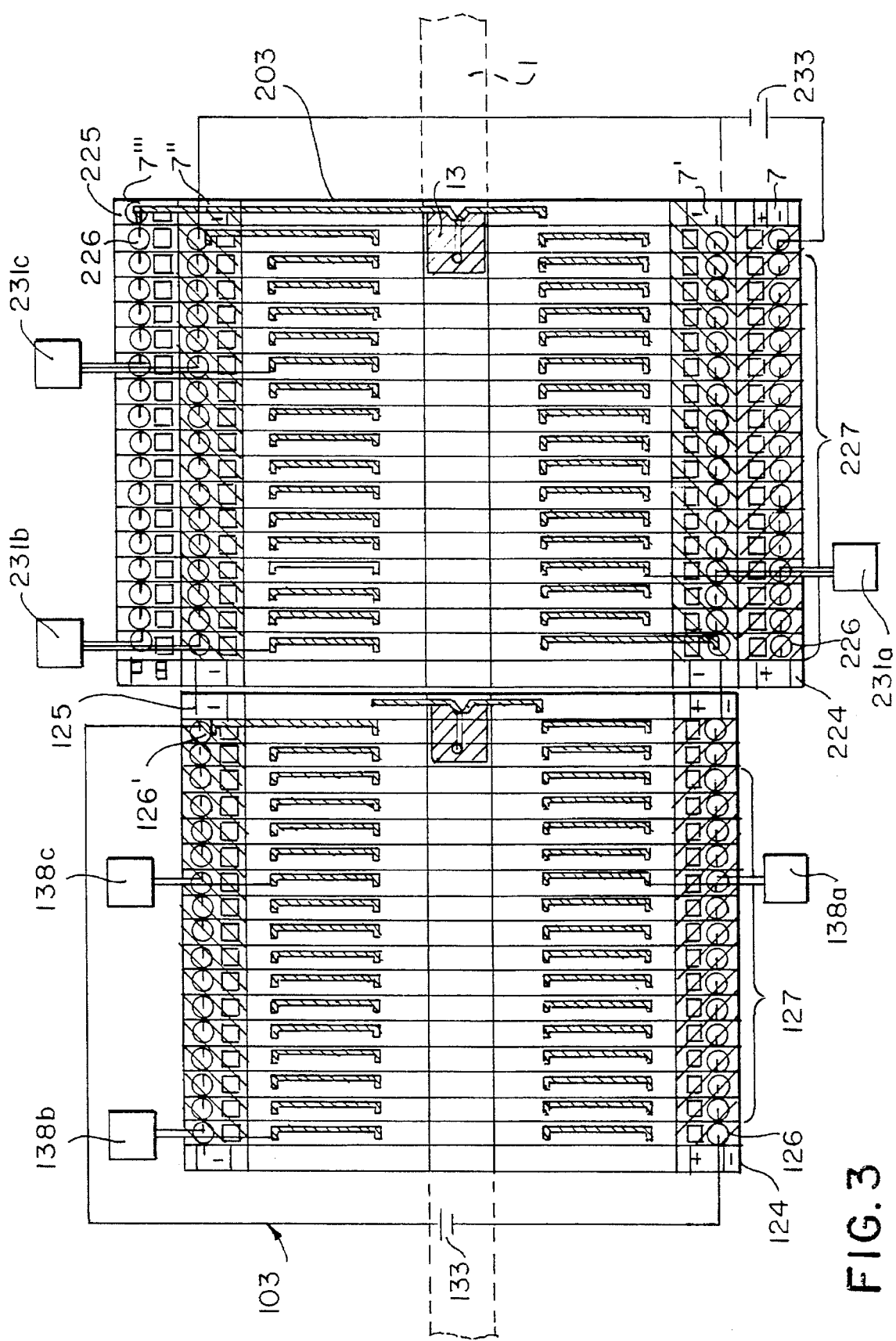
FIG. 3 is a diagrammatic plan representation of a modular control system including a pair of terminal block assemblies to which the building operating components are connected, each of the assemblies including distribution bus bar means.

Referring now to FIG. 3, a pair of terminal block assemblies 103 and 203 are mounted on a grounded support rail 1. Power from direct-current voltage source 133 is supplied across power supply terminal blocks 126 and 126', thereby to energize the assembly. Signals from the remotely located actuators with signal leads 138a, 138b, 138c are supplied to associated circuits on the circuit boards via the control signal terminal boards 127. The positive terminal of direct current voltage source 233 is connected with distribution bar 7 via power supply terminal block 226, and the negative terminal is connected with distribution bars 7' and 7". Active sensors 231a, 231b and 231c having voltage supply and signal leads are connected with corresponding control circuits on the printed circuit boards via control signal terminal blocks 227.

Figure 4:
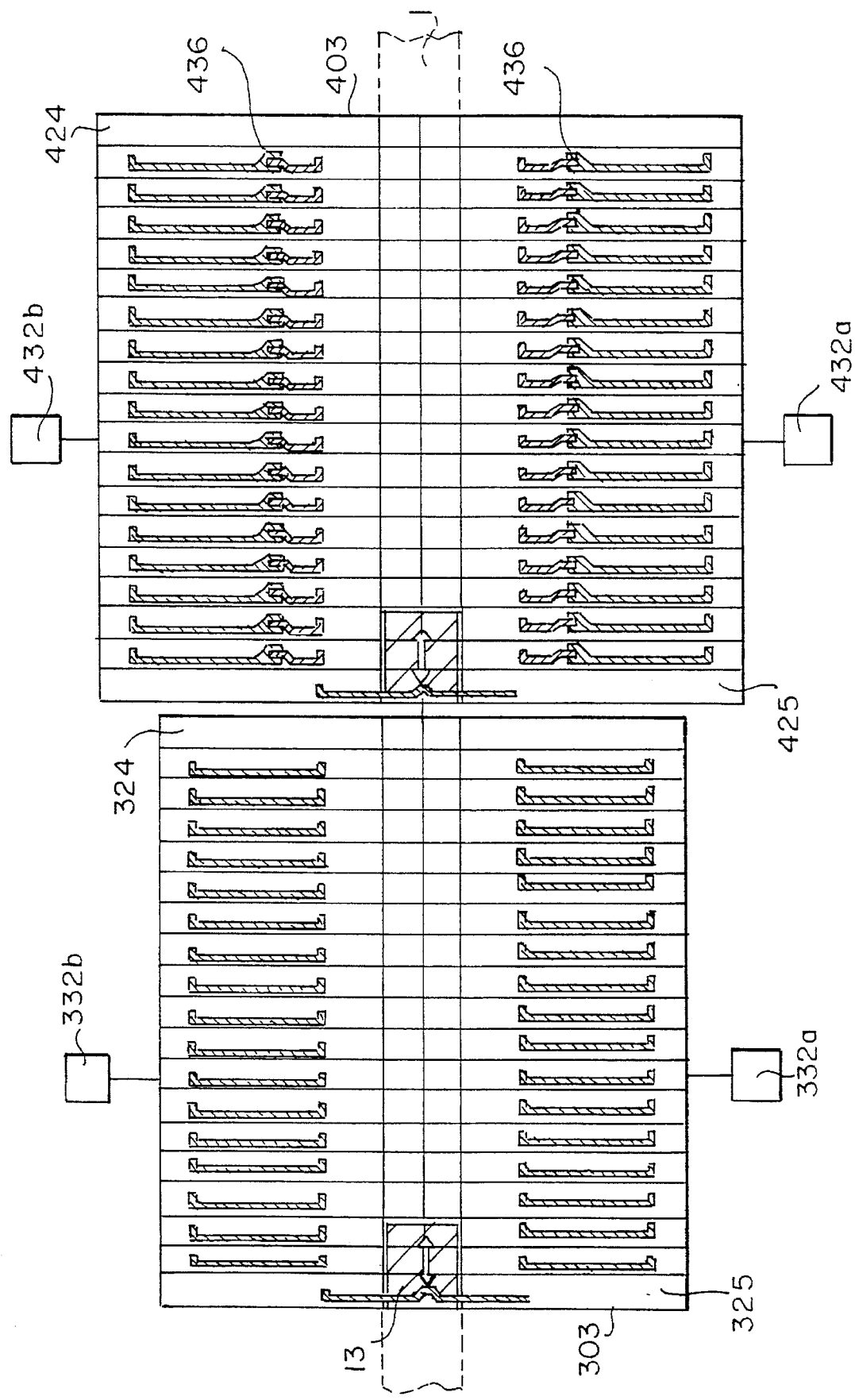
FIG. 4 is a diagrammatic plan illustration of a modification of the connector bock assembly of FIG. 3, wherein the use of distribution bus bar means is avoided.

In the arrangement of FIG. 4, the distributor bars of FIG. 3 are eliminated, and the terminal block assemblies 303 and 304 are mounted on the support rail 1. In this case, passive digital sensors 332a and 332b are connected with the printed circuit boards of assembly 303, and passive digital sensors 432a and 432b are connected with printed circuit boards on assembly 403. The passive sensors are connected bilaterally with corresponding terminals on the signal junction blocks 327 and 427, respectively, so that the assemblies have a rather large number of inputs and outputs. Such sensors can be supplied externally via a corresponding voltage or potential multiplication. Separation plugs 436 may be provided which permit electrical separation of the input and output sides from the input into the module 2, and also facilitate measurement of the electrical parameters at these points. In this embodiment, power supply terminal blocks are not required, so that each terminal block assembly will require only a single ground terminal block 325 and 425, respectively, and only one end support terminal block 324 and 424, respectively.

Figure 14:
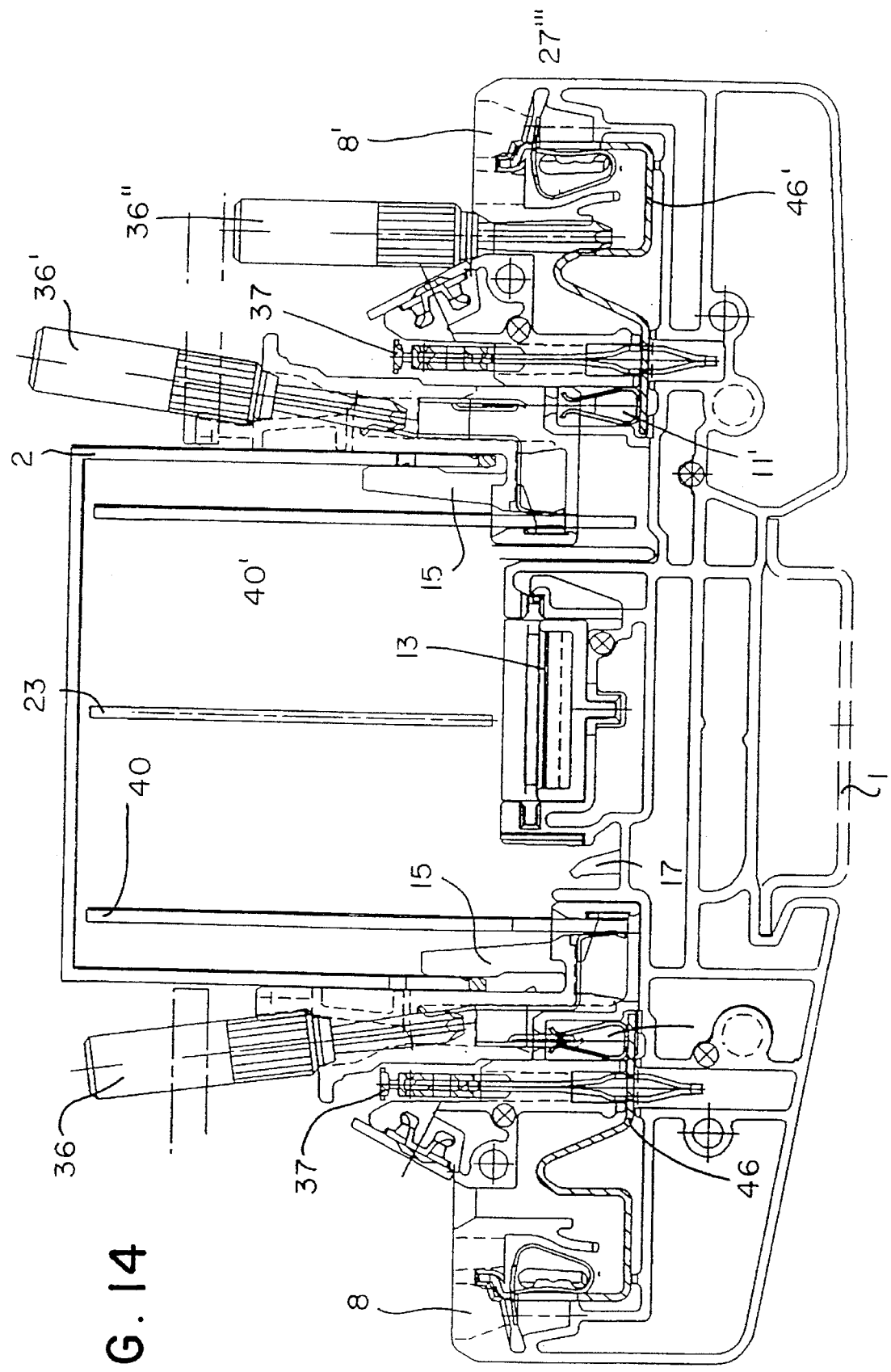
FIG. 14 is a sectional view of a second modification of the supply signal terminal block of FIG. 7 including removably test plug connections.

Referring now to FIG. 14, according to a preferred embodiment of the invention, the supply signal terminal block 27'" includes separable test access plugs 36, 36', 36" that afford access to the resilient plug-in terminal 11, printed circuit board 40', and the bus bar 46' between the terminals 11' and 8', respectively. Thus, these removable plugs permit testing and measuring of the voltages at various locations of the supply signal terminal block 27'".

Referring now to FIGS. 15a–15c, a signal terminating block 57 is provided for mounting on the end of the central bus bar means 13, thereby to prevent a signal reflection at the end of the bus bar 13. To this end, a conductive plate 62 provided that is electrically connected with the bus bar means 13 by resilient plug-in terminals 59. Electrically connected beneath the conductive plate 62 or a plurality of terminating resistors 58 which serve to prevent undesirable reflections at the end of bus bar conductor means 13.

Figure 16:
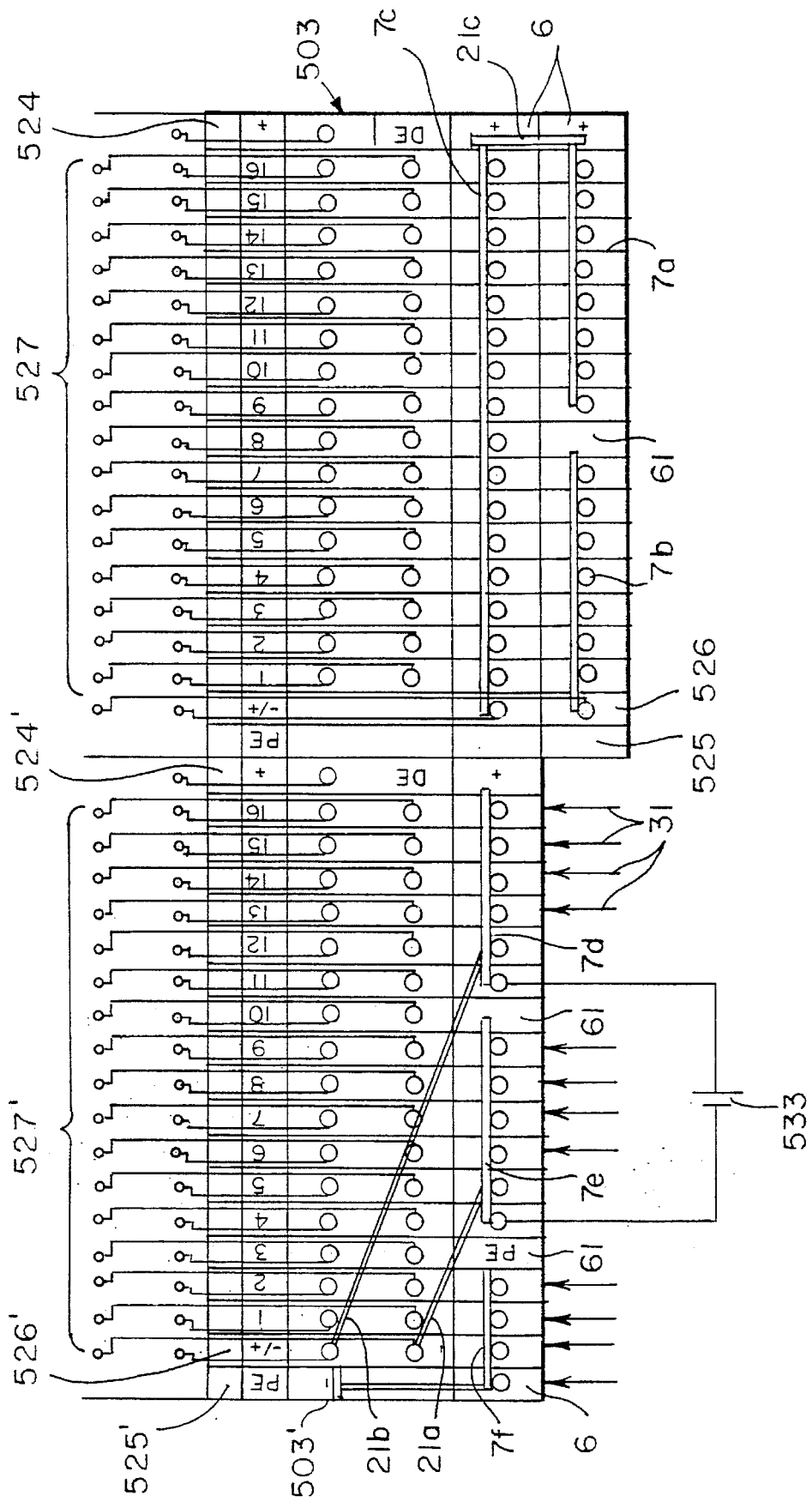
FIG. 16 illustrates an arrangement of non-conducting elements for isolating selected distribution members.
Figure 17:
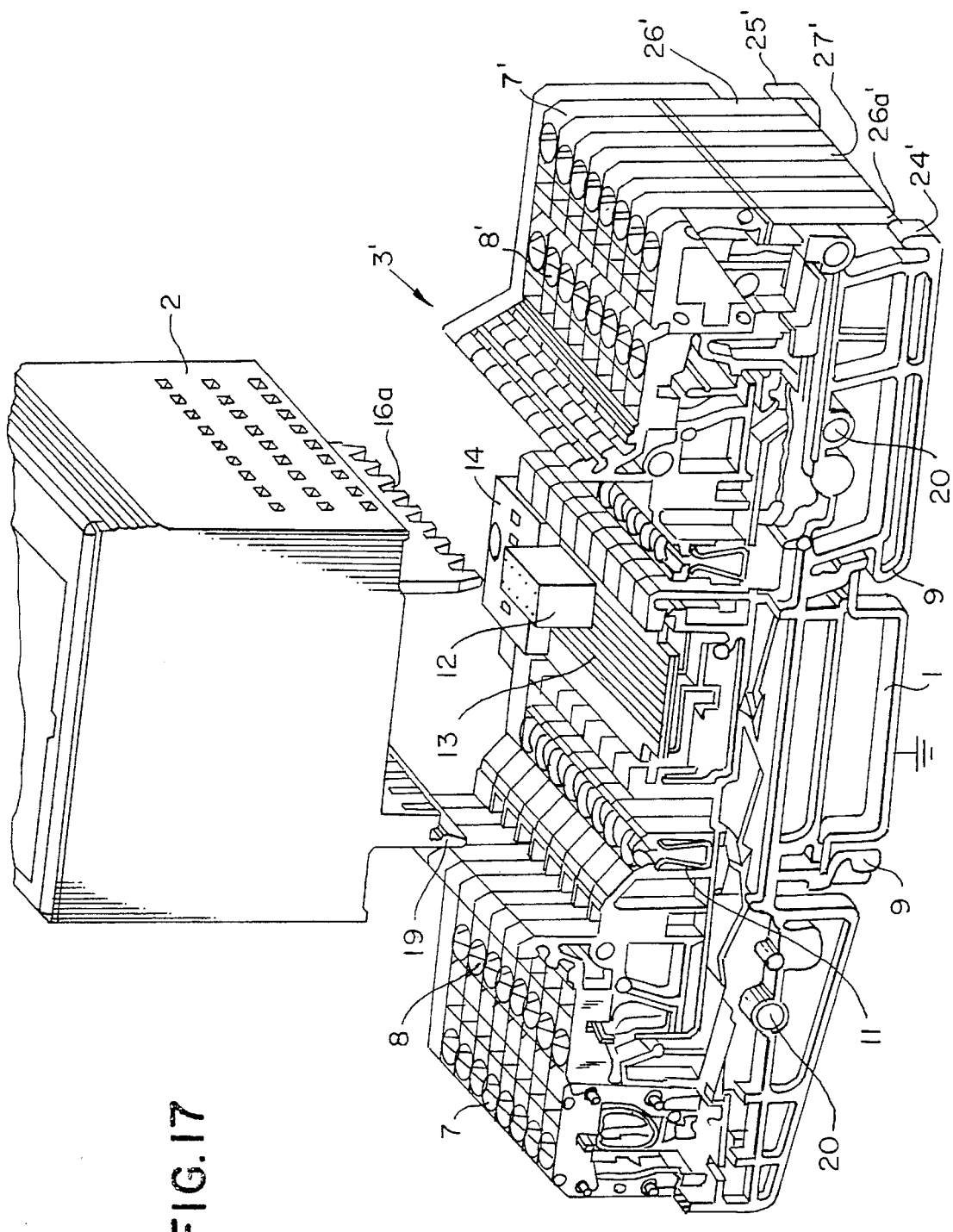
FIG. 17 is a perspective view of an assembly including the terminal blocks of FIGS. 6 and 7.

Referring now to FIG. 16, it is possible to provide on one side of a terminal block assembly 503, 503' a distribution format formed by the arrangement of a plurality of distribution bars 7a–7f, thereby to permit the application of different electrical voltages to the terminal blocks of the assembly. For this purpose, between the terminals of identical electrical potential formed by cross-connecting the distribution bar means, there is inserted at the transition point at least one non-conductive separation element 61. In this way, the cross-linking of the aligned distribution bars 7a and 7b, 7d and 7e, and 7e and 7f is avoided. In the next following distribution bars 7d, 7f of the aligned elements, one can apply another electrical potential via an external voltage supply means 533, or an internal link 21a, 21b to the power supply terminal block 526'. In this way, it is particularly possible, when working with terminal block assemblies that are not constructed for identical loads and reactors or the like, to provide a simple supply with different electrical potentials. It is furthermore possible to use these cross-linking separating elements 61 for marking the applied electrical potentials, for example, in the form of labeling. It is also possible to combine the previously mentioned possibility for inserting a bridge element 21c for the electrical connection of two distributor bars 7a, 7b with the above mentioned possibility of the different electric potentials longitudinally of the terminal block.

While in accordance with the provisions of the patent statutes the preferred forms and embodiments of the invention have been illustrated and described, it will be apparent with those skilled in the art the various changes may be made without deviating from the inventive concept set forth above.

What is claimed is:

1. A modular control system for controlling the electrically-operable components of an automated building or the like, comprising:
   (a) at least one terminal block assembly (3) including a plurality of laterally-aligned terminal blocks adapted for mounting on a grounded support rail (1);
   (b) internal bus bar means (3) mounted on said assembly for electrically connecting together each terminal block mounted on the rail;
   (c) means (14) for connecting said terminal block assembly with an associated field bus bar (4);
   (e) at least one electronics module (2) for controlling the operation of said components, respectively; and
   (f) a plurality of distributor bar means (7, 7') for distributing electrical power laterally between said terminal blocks;
   (g) said terminal block assembly including:
      (1) at least one ground terminal block (25') for connecting said electronics module with the support rail;
      (2) at least one power supply terminal block (25') for supplying power to said electronics module; and
      (3) at least one control signal supply terminal block (27') for supplying control signals to and from said electronics module;
   (h) said power supply terminal block and said control signal supply terminal block having generally similar configurations and each including:
      (1) a first portion (6) for removably supporting a first one (7) of said distributor bar means;
      (2) a second portion (8) for supplying control signals to and from said electronics module;
      (3) a central portion arranged above said mounting rail and operable to support said internal bus bar means above said mounting rail, said electronics module being removably connected with said internal bus bar means;
      (4) a third portion (8') for supplying control signals to and from said electronics module; and
      (5) a fourth portion (6') for removably supporting a second one (7') of said distributor bar means.

2. Apparatus as defined in claim 1, wherein said terminal block assembly also includes an end support terminal block (24), said power supply terminal block and said control signal supply terminal blocks being arranged between said ground and end support terminal blocks.

3. Apparatus as defined in claim 1, wherein said terminal blocks have a symmetrical structure relative to said support rail.

4. Apparatus as defined in claim 1, wherein said ground terminal block (25') is both mechanically and electrically connected with the support rail, said ground terminal block including a first plug-in terminal (11) connected with said electronics module.

5. Apparatus as defined in claim 1, and further including means electrically connecting said ground terminal block with the remaining terminal blocks.

6. Apparatus as defined in claim 1, and further including means electrically connecting said power supply terminal block with said electronics module and with the remaining terminal blocks.

7. Apparatus as defined in claim 1, wherein said distributor bar means (7, 7') includes supply terminals (44, 44') arranged on opposite sides of said electronics module; and futher wherein said power supply terminal block (26') includes internal conductor means (45, 45') connecting said supply terminals with the electronic module components.

8. Apparats as defined in claim 1, wherein said control signal terminal block (27') includes first mounting means (6, 6') connected with said distributor bar means, second terminal means (8, 8') adapted for connection with signal conductors (C$_1$, 'C$_2$'), and third terminal means (11, 11') adapted for connection with said electronics module.

9. Apparatus as defined in claim 8, wherein said first mounting means (6, 6') includes latch means for latching said distributor bar means to said supply signal mean, said latch means being color-coded.

10. Apparatus as defined in claim 1, and further wherein said supply signal terminal block (27') includes signal tap-off means (37, 37') for transmitting said control signals to other terminal blocks of said assembly.

11. Apparatus as defined in claim 1, wherein said end support and said ground terminal blocks include foot means for connecting said assembly with the support rail.

12. Apparatus as defined in claim 1, wherein a plurality of different control signal terminal blocks are connected with different components of said module, respectively.

13. Apparatus as defined in claim 1, and further including internal bus bar means (13) centrally arranged on said assembly, and separable connector means (14) for removably connecting said bus bar means with said terminal block assembly.

14. Apparatus as defined in claim 13, wherein said internal bus bar means and said separating means are arranged beneath and are covered by said electronics module.

15. Apparatus as defined in claim 14, wherein said electronics module extends partially above said terminal blocks.

16. Apparatus as defined in claim 13, and further including signal termination means (57) connected with the end of said signal internal bus bar means, said signal termination means including at least one termination resistor (58).

17. Apparatus as defined in claim 1, wherein said electronics module contains separable plug terminal means connecting components (40) contained within said electronics module with corresponding terminals (11) carried by said terminal blocks.

18. Apparatus as defined in claim 1, and further including mounting means (6) for connecting said distributor bar means with said assembly.

19. Apparatus as defined in claim 13, and further including field bus means (4) for connecting said internal bus bar (13) to a field bus.

20. Apparatus as defined in claim 19, wherein said field bus connecting means is arranged at one end of the mounting rail.

21. Apparatus as defined in claim 1, wherein said terminal block assembly, further includes non-conductive spacer means (61) arranged between includes pairs of said distributor bar means for separating differing electric potentials from each other.

* * * * *